United States Patent
Ohsawa (10) Patent No.: US 10,310,689 B2
(45) Date of Patent: Jun. 4, 2019

(54) SENSOR SHEET AND SENSOR PANEL

(71) Applicant: POLYMATECH JAPAN CO., LTD., Saitama, Saitama (JP)

(72) Inventor: Yuta Ohsawa, Saitama (JP)

(73) Assignee: POLYMATECH JAPAN CO., LTD., Saitama (JP)

(*) Notice: Subject to any disclaimer, the term of this patent is extended or adjusted under 35 U.S.C. 154(b) by 0 days.

(21) Appl. No.: 15/508,539

(22) PCT Filed: Aug. 24, 2015

(86) PCT No.: PCT/JP2015/073739
§ 371 (c)(1),
(2) Date: Mar. 3, 2017

(87) PCT Pub. No.: WO2016/039127
PCT Pub. Date: Mar. 17, 2016

(65) Prior Publication Data
US 2017/0262098 A1    Sep. 14, 2017

(30) Foreign Application Priority Data

Sep. 12, 2014   (JP) .................... 2014-186900

(51) Int. Cl.
*G06F 3/041* (2006.01)
*G06F 3/044* (2006.01)
(Continued)

(52) U.S. Cl.
CPC .......... *G06F 3/044* (2013.01); *G06F 3/03547* (2013.01); *H03K 17/9622* (2013.01);
(Continued)

(58) Field of Classification Search
CPC ......... G06F 3/041; G06F 3/0416; G06F 3/044
(Continued)

(56) References Cited

U.S. PATENT DOCUMENTS 8,820,949 B2 *   9/2014   Takeda ................... H01H 13/83
                                                         362/23.03
2009/0201441 A1 *   8/2009   Laney ............... G02F 1/133308
                                                         349/64
(Continued)

FOREIGN PATENT DOCUMENTS

JP   2010-170447 A   8/2010
JP   2013-098050 A   5/2013
(Continued)

OTHER PUBLICATIONS

International Search Report for PCT Patent App. No. PCT/JP2015/073739 (dated Oct. 13, 2015) with English language translation thereof.

*Primary Examiner* — Calvin C Ma
(74) *Attorney, Agent, or Firm* — Cermak Nakajima & McGowan LLP; Tomoko Nakajima (57) ABSTRACT

To provide a sensor panel and a sensor sheet, in which a conductive fine line and a silhouette of the conductive fine line is difficult to be seen through a display portion during illumination and in which the visibility of the display portion during illumination is good. A light diffusion layer is provided on the sensor sheet, the light diffusion layer diffusing a light of an internal light source L and transmitting the light to sensor electrodes.

7 Claims, 5 Drawing Sheets

(51) Int. Cl.
 *H03K 17/96* (2006.01)
 *G06F 3/0354* (2013.01)
(52) U.S. Cl.
 CPC .............. *G06F 2203/04112* (2013.01); *H03K 2217/96015* (2013.01); *H03K 2217/96031* (2013.01)
(58) Field of Classification Search
 USPC .................................................. 345/173, 174
 See application file for complete search history.

(56) References Cited

U.S. PATENT DOCUMENTS

| | | | |
|---|---|---|---|
| 2013/0207930 A1* | 8/2013 | Lin ......................... | G06F 3/044 345/174 |
| 2013/0215067 A1 | 8/2013 | Hwang et al. | |
| 2015/0027614 A1* | 1/2015 | Mori ........................ | C09D 7/69 156/60 |

FOREIGN PATENT DOCUMENTS

| | | |
|---|---|---|
| JP | 2013-540331 A | 10/2013 |
| JP | 2014-081766 A | 5/2014 |

\* cited by examiner

SENSOR SHEET AND SENSOR PANEL

TECHNICAL FIELD

The present invention relates to a capacitance sensor sheet on which touch operation is performed through an input, and a sensor panel having the sensor sheet provided in a panel substrate.

BACKGROUND ART

A capacitance sensor sheet on which touch operation is performed through an input is used in many electronic devices, and an inexpensive sensor sheet having high reliability and high quality is in need. ITO or electroconductive polymer has been used in transparent electrodes that are important components of the sensor sheet; however, there is an issue in that the cost is extremely high due to processing such as etching work.

On the other hand, rather than forming the sensor electrodes with such an expensive electrically conductive material, there is known a sensor sheet in which the sensor electrodes are formed with an inexpensive conductive fine line (Japanese Unexamined Patent Application Publication No. 2014-81766); however, while the material of the conductive fine line itself is inexpensive, the method that uses the photosensitive material and the processes in forming the conductive fine line by etching are complicated and the cost is still disadvantageously high.

CITATION LIST

Patent Literature

PTL 1: Japanese Unexamined Patent Application Publication No. 2014-81766

SUMMARY OF INVENTION

Technical Problem

Other than the above, as an inexpensive and, further, easy method, there is a method that forms the conductive fine line by silver ink printing. However, in such a conductive fine line, there are problems such as, for example, the conductive fine line being seen through a thin print layer forming a display portion when the display portion is illuminated by an internal light source, such as an LED, mounted on the substrate, or the silhouette of the conductive fine line appearing on the back surface of the print layer such that the silhouette is seen from the outside of the sensor panel. In order to overcome the above, it is only sufficient that the layer thickness of, for example, a white print layer forming the display portion is increased, or the color is made thick as possible, so as to be hidden from the front side. However, with the above, the illumination luminance of the display portion becomes low and the visibility thereof becomes reduced. Regarding the above, the output of the internal light source may be increased but, then, a new problem in that the power consumption greatly increases occurs.

The present invention has been made with the conventional technical background described above. The object thereof is to provide a sensor panel and a sensor sheet in which the conductive fine line and the silhouette of the conductive fine line is difficult to be seen in the display portion during illumination, and in which visibility of the display portion is good during illumination.

Solution to Problem

The invention that achieves the object described above includes a sensor sheet and a sensor panel.

In other words, the present invention is a sensor sheet fitted on a back surface side of a panel substrate including a display portion that is illuminated by an internal light source, an input operation performed from a front surface side of the panel substrate, the sensor sheet including, a sensor electrode layer including a conducive fine line provided on the back surface side of the panel substrate, and a diffusion layer provided between the sensor electrode layer and the internal light source, the light diffusion layer diffusing a light of the internal light source and transmitting the light to the sensor electrode layer.

In the known art, a portion of a light that has been emitted from an internal light source is shielded by a sensor electrode layer forming a conductive fine line and reaches a print layer of a display portion. In other words, the light proceeds from the light source in a straight line, and the silhouette of the conductive fine line easily appears on the back surface of the print layer forming the display portion. On the other hand, the light emitted from the internal light source is incident on a diffusion layer provided between the sensor electrode layer and the internal light source, the light diffusion layer diffusing a light of the internal light source and transmitting the light to the sensor electrode layer, such that the proceeding direction of the light is changed in a random manner. While a portion of the light is shielded by the sensor electrode layer formed of the conductive fine line, owing to the light diffusion layer, since the proceeding direction of the light is random, a clear silhouette is not easily created. With the above configuration, in the sensor sheet of the present invention, since the conductive fine line and the silhouette of the conductive fine line are difficult to be seen through the display portion during illumination, the illumination becomes uniform and the appearance improves. Furthermore, since the conductive fine line and the silhouette of the conductive fine line do not have to be hidden by increasing the thickness of the print layer of the display portion, the illumination luminance of the display portion is high and visibility thereof can be improved.

The conductive fine line may be formed of a conductive coating film having a line width of 5 µm to 300 µm.

While the conductive coating film is inexpensive, it is difficult to form a conductive fine line having a fine line width. However, in the present invention, since the silhouette of the conductive fine line does not easily appear in the display portion even when the conductive fine line has a certain thickness, an inexpensive conductive fine line can be formed with the conductive coating film.

The light diffusion layer may be an uneven layer including an uneven surface on an internal light source side. Specifically, the light diffusion layer may be a print layer including an uneven surface on the internal light source side formed by a filling material and a coating film. Furthermore, light diffusion layer may be a crimped film including an uneven surface formed by a crimped surface on the internal light source side.

A diffusion sheet added with a filling material having optical diffusion characteristics may be conceived to be used as the light diffusion layer; however, with such a diffusion sheet, the transmittance of light decreases and the illumination luminance becomes dark, and, rather, the visibility disadvantageously decreases. Having said that, if the added amount of filling material is reduced, diffusion of light becomes difficult and the conductive fine line is disadvantageously seen through. Conversely, in the present invention, since the light diffusion layer is formed as an uneven layer that includes an uneven surface on the internal light source side, the processing direction of the light proceeding from the internal light source in a straight manner can be reliably diffused. Furthermore, by printing or coating using a coating material that contains such a filling material, a printing layer having such an uneven layer can be fabricated in a relatively easy manner. Furthermore, the uneven layer can be fabricated easily with a crimped film having a crimped surface serving as the uneven surface.

The present invention provides sensor panel including a panel substrate, a decorative layer provided on the panel substrate, the decorative layer including a display portion illuminated by the internal light source, and any one of the sensor sheet described above that is provided on a back surface side of the panel substrate.

In addition to the functions and effects of the sensor sheet described above, the sensor panel of the present invention is capable of devising illumination display having ease of visibility, brightness, and a beautiful appearance during illumination, serving as a sensor panel that is capable of illumination and display at a dark place such as an on-vehicle electrical component or a home appliance. Furthermore, the conductive fine line itself of the sensor sheet on the back surface side can be made difficult to see with the decorative layer on the panel substrate.

The present invention described above may be configured such that an interlayer distance T that is a distance in which the decorative layer and a sensor electrode layer of the sensor sheet are set apart, and a line width W of a conductive fine line satisfies T≥20W.

By setting the interlayer distance T as above, the silhouette of the conductive fine line does not appear in the display portion during illumination and the display portion can be illuminated in a uniform manner.

Advantageous Effects of Invention

In the sensor sheet and the sensor panel of the present invention, owing to the uniform illumination of the display portion, the appearance is improved, and the illumination luminance and the visibility of the display portion is high; accordingly, a high-quality touch panel for input operation in various electronic devices capable of being used conveniently in dark places can be devised. Moreover, since the sensor electrode layer of the conductive fine line can be formed by printing, the sensor sheet and the sensor panel can be manufactured at a low cost.

DESCRIPTION OF EMBODIMENTS

Hereinafter, embodiments of the present invention will be described with reference to the drawings. Note that members that are common among each of the embodiments will be attached with the same reference numerals and redundant description thereof will be omitted. Furthermore, redundant descriptions of common materials, functions, effects, and the like will be omitted as well.

First Embodiment [FIGS. 1 to 7]

Figure 1:
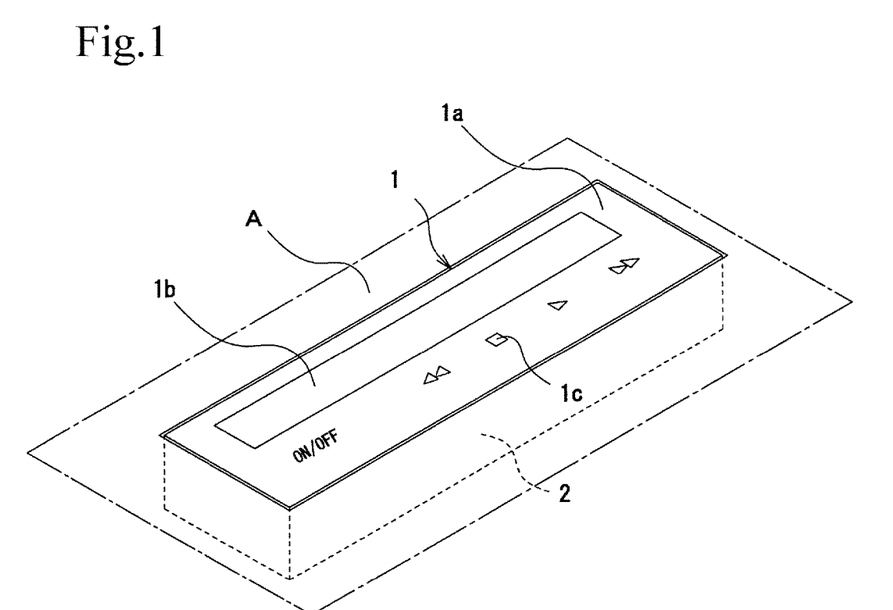
FIG. 1 is an external perspective view of a sensor panel according to an embodiment.

A sensor panel 1 of the present embodiment is used as a control panel of a car audio device, for example. The sensor panel 1 is incorporated in a housing A as a portion of an exterior part of the car audio device. Accordingly, the ease of visibility of the display portion during illumination is considered as an important quality requirement.

Description of Sensor Panel 1:

The sensor panel 1 is formed in a box shape having an opening on one surface and includes a panel unit 2, and a sensor sheet 3 that is installed inside the panel unit 2. A display window 1b, and display portions 1c that display characters and symbols are formed in a display and operation surface 1a of the sensor panel 1. The peripheral portions surrounding the display portions 1c are operation areas (sensor areas) 1d that respond to touch operation. Note that in the illustrated sensor panel 1, while the display and operation surface 1a is exemplified as having a flat surface, the sensor panel 1 may be formed as a curve-shaped display and operation surface that is entirely or partially curved.

Figure 3:
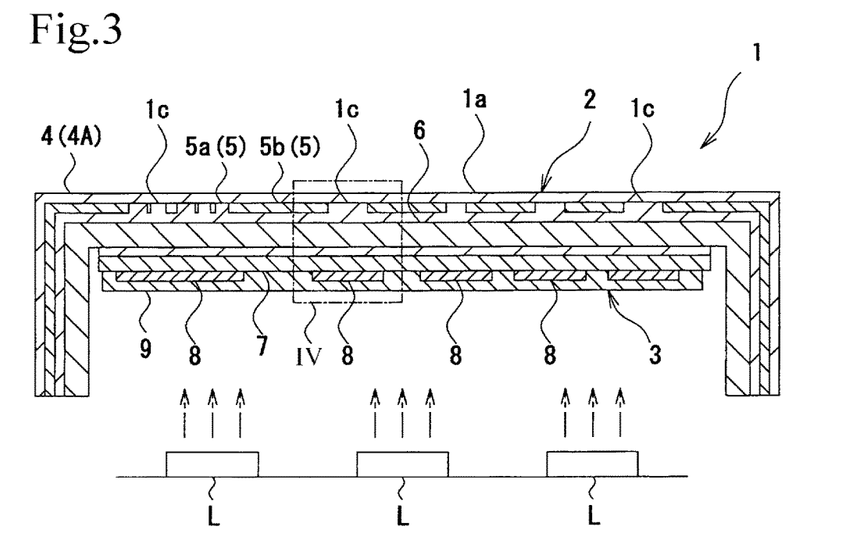
FIG. 3 is a cross-sectional view taken along line III-III in FIG. 2.

Description of Panel Unit 2:

The panel unit 2 is formed into a thin type in which an exterior portion 4, a decorative layer 5, and a substrate 6 are layered. Furthermore, the sensor sheet 3 includes a base sheet 7, sensor electrodes 8, and a diffusion layer 9 that are layered on each other, and is fixed to an inner surface of the panel unit 2 with an adhesive layer 10. The adhesive layer 10 is a thin sheet and has a translucency that does not impair the visibility of the illuminated and displayed of the display portions 1c.

A front surface of the exterior portion 4 of the panel unit 2 is an operation surface on which touch operation is performed. Considering the smoothness required for the operation surface, the exterior portion 4 of the present embodiment is formed of a thermoplastic resin film 4A. A thermoplastic resin film is used since forming can be easily performed by heating, a flat surfaced-shaped or a curved surfaced-shaped display and operation surface 1a can be easily formed as well, and the degree of freedom in shape is high. Accordingly, a material excellent in wear resistance, abrasion resistance, light resistance, weather resistance, and the like is desirably used for the resin film 4A and, furthermore, when integrally molded together with the substrate 6, desirably, a material with good moldability is used. As such a material, an acrylic film, a polyethylene terephthalate film, a hard coat type polycarbonate resin film, and the like can be used. Note that it is not essential that the exterior portion 4 is the resin film 4A. For example, the decorative layer 5 may be formed on the front surface of the substrate 6, the display portions 1c may be formed in the decorative layer 5 with a laser and the like, and the exterior portion 4 may be formed by coating a hard coat layer thereon.

Figure 2:
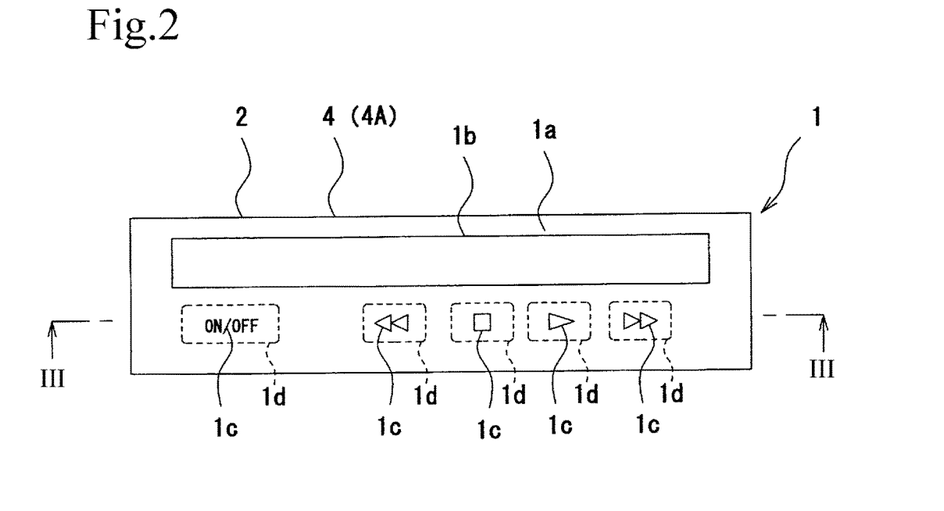
FIG. 2 is a plan view of the sensor panel in FIG. 1.

The decorative layer 5 on the back surface of the resin film 4A is formed of a light transmitting layer 5a and a light shielding layer 5b. The light shielding layer 5b is formed on the back surface of the resin film 4A so as to avoid the display portion 1c, and while filling the hollow shaped portions that are to become the display portions 1c, the light transmitting layer 5a is layered and formed on the back surface of the light shielding layer 5b. Specifically, as illustrated in FIG. 2, the light shielding layer 5b is formed on the back surface of the resin film 4A in portions other than the display window 1b and the display portion 1c, and a light transmitting layer 5a is formed in the display portions 1c so as to serve as an external appearance of the sensor panel 1. A feature of the claimed invention is a technique that, while the light transmitting layer 5a is illuminated and displayed in a bright manner during illumination, hides the wiring patterns of the sensor electrodes 8 so that the wiring patterns of the sensor electrodes 8 that are seen through are almost not visible.

Desirably, the decorative layer 5 is a resin layer and is a material that has good moldability when integrally molded together with the substrate 6. In integrally molding together with the substrate 6, the resin film 4A on which the decorative layer 5 has been formed is inserted into a mold to perform integral molding together with the substrate 6. The decorative layer 5 can be formed on the resin film 4A by printing. However, the method is not limited to the above method. As for the material of the decorative layer 5, an acrylic resin, a vinyl resin, a polyester resin, a urethane resin, or a polycarbonate resin is preferable.

Since the light transmitting layer 5a of the decorative layer 5 is a portion that attracts attention as the display portions 1c of the sensor panel 1, the light transmitting layer 5a cannot have a transparency that allows the substrate to be clearly visible. The above is because, since conductive fine lines 8a of the sensor electrodes 8 are easily seen in the display portions 1c of the sensor panel 1, the appearance becomes bad. The wiring patterns of the sensor electrodes 8 are not needed as a decoration. Examples of the decorative layer 5 not having transparency include a translucent white layer, a matt layer with a thick haze, an uneven layer with a high degree of optical diffusion, and a colored light transmitting layer colored into various colors. By providing a decorative layer 5 including at least the light transmitting layer 5a formed as such a non-transparent layer, it is possible to make the wiring pattern beyond the light transmitting layer 5a, which comes in sight in the display portions 1c, difficult to see.

The substrate 6 is a molding body constituting the panel unit 2, and a transparent thermoplastic resin is used. The thermoplastic resin includes, for example, a polycarbonate (PC) resin, a polymethyl methacrylate (PMMA) resin, an acrylonitrile-styrene (AS) resin, an acrylonitrile-butadiene-styrene (ABS) resin, and an alloy resin of the above. Note that it is not essential that the thermoplastic resin that becomes the substrate 6 is transparent. For example, in a case in which the display window 1b is not needed, a translucency resin that is not colorless and that is not transparent may be used in place of the light transmitting layer 5a so as to function as illuminations of the display portions 1c as well as to function to hide the wiring patterns of the sensor electrodes 8.

Description of Sensor Sheet 3:

The sensor sheet 3 includes the base sheet 7, the sensor electrodes 8, and the diffusion layer 9 that are layered on each other, and the base sheet 7 is fixed to the inner surface of the panel unit 2 with the adhesive layer 10.

The base sheet 7 is formed in a flat sheet shape. A material such as, for example, a polyethylene terephthalate (PET) resin, a polyethylenenaphthalate (PEN) resin, a polycarbonate (PC) resin, a polymethyl methacrylate (PMMA) resin, a polypropylene (PP) resin, a polyurethane (PU) resin, a polyamide (PA) resin, a polyethersulfone (PES) resin, a polyetheretherketone (PEEK) resin, a triacetylcellulose (TAC) resin, and a cycloolefin polymer (COP) may be used. Surface treatments such as providing a primer layer that increases the adhesion with the electroconductive polymer, and an overcoat layer aimed to prevent, for example, an electro static charge, and the like may be performed on the base sheet 7 formed of the above material.

The above colorless and transparent resin film formed with the above as the raw material may be used for the base sheet 7. The reason for being "transparent" is because, in a case in which the sensor panel 1 is used as a display as well, for example, the display on the display provided on the back surface of the sensor sheet 3 can be made to be visible from the outside of the sensor panel 1 through the "transparent" base sheet 7. Accordingly, "transparent" herein refers to a transparency that enables the display element on the back surface of the sensor sheet 3 to be visible from the front surface side of the sensor sheet 3. On the other hand, if there is no need for the display element on the back surface of the base sheet 7 to be visible from the outside, a resin film having the above-described translucent material as the raw material can be used as the base sheet 7.

Figure 5:
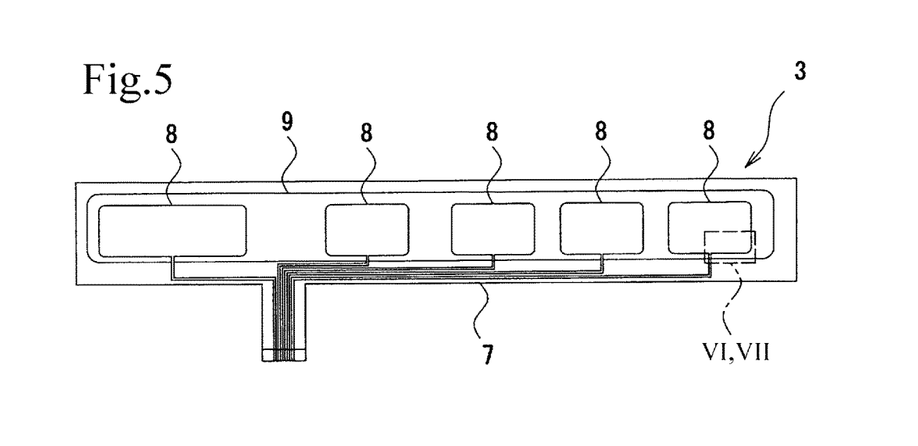
FIG. 5 is a plan view of the sensor sheet in FIG. 1.

The sensor electrodes 8 are formed by the conductive fine lines 8a, and have the outer shapes of the operation areas (sensor areas) 1d illustrated in FIG. 5.

The wiring patterns of the sensor electrodes 8 formed by the conductive fine lines 8a are, mainly, designed differently in a case of a "self-capacitance system" and in a case of a "mutual capacitance system".

Figure 6:
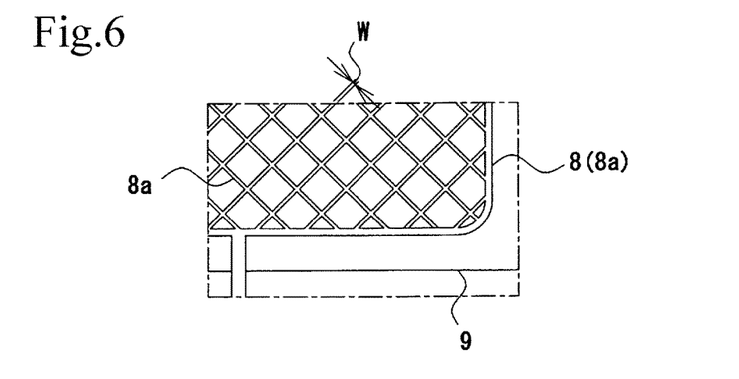
FIG. 6 is a plan view of a wiring pattern of a sensor electrode according to a first aspect in which portions VI and VII in FIG. 5 have been enlarged.

In Case of Self-capacitance System [FIG. 6]: In the case of the self-capacitance system, as illustrated in FIG. 6, the conductive fine lines 8a may be patterned in a mesh shape so that the entire operation areas 1d become a single conductive area.

The line width of the mesh-shaped conductive fine lines 8a is preferably 5 µm to 300 µm. In order to form conductive fine lines 8a that are under 5 µm, etching work or laser machining is required and the cost may, disadvantageously, become high. The conductive fine lines 8a with a line width of under 5 µm is itself difficult to visually recognize and the light diffusion layer 9 described below will no longer be required. On the other hand, when the line width is over 300 µm, the distance between the decorative layer 5 and the light diffusion layer 9, or the distance between the decorative layer 5 and the sensor electrodes 8 exceeds 6 mm; accordingly, the thicknesses of the sensor panel 1 and the sensor sheet 3 excessively increase, which is not desirable.

Regarding the mesh-shaped pattern, the pitch between the conductive fine lines 8a is preferably 50 µm to 10 mm. In a case in which the pitch is over 10 mm, the gap between the conductive fine lines 8a is too large; accordingly, when the operation area 1d is touched with a fingertip, the fingertip may not overlap the conductive fine line 8a and the sensor sensitivity may disadvantageously decrease. On the other hand, when under 50 μm, since the pitch is too narrow with respect to the wiring width, the area occupied by the conductor (the conductive fine lines 8a) in the sensor electrodes 8 increases; accordingly, the transmittance of the light emitted by an internal light source L, such as an LED, mounted on the substrate becomes low, and the illumination luminance of the display portions 1c may, disadvantageously, be greatly decreased. From the above viewpoint, the preferable range is 400 μm to 1500 μm.

The area occupied by the conductor (the conductive fine lines 8a) in such sensor electrodes 8 is preferably in the range of 80% to 98% in "opening ratio" defined below.

Opening ratio=area of opening portion/area of sensor areas

In a case in which the opening ratio is under 80%, the transmittance decreases and the illumination luminance of the display portions 1c may disadvantageously become low. On the other hand, in a case in which the opening ratio exceeds 98%, the area or the conductor (the conductive fine lines 8a) occupying the operation areas 1d is small; accordingly, the capacitance change is small and the sensor sensitivity may disadvantageously decrease.

Such conductive fine lines 8a can be formed with a conductive coating film or a metal layer. Among the above, a configuration using a conductive coating film is desirable and, specifically, using conductive ink, such as a so-called silver paste that is silver powder dispersed in a liquid resin, is desirable from the point of ease of patterning and cost.

Figure 7:
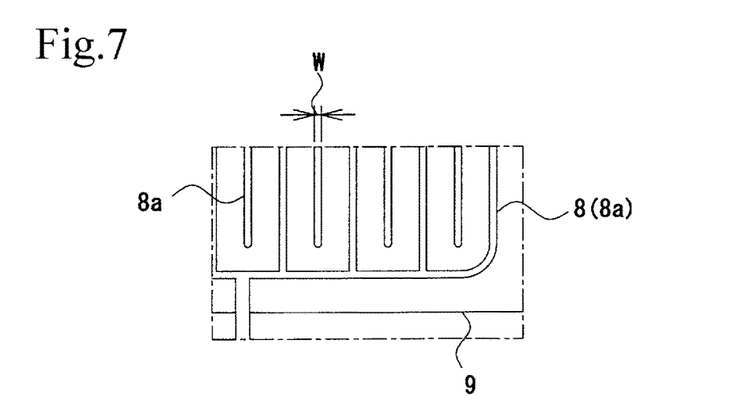
FIG. 7 is a plan view of a wiring pattern of a sensor electrode according to a second aspect in which portions VI and VII in FIG. 5 have been enlarged.

In Case of Mutual Capacitance System [FIG. 7]: As a second mode, in a case in which the touch sensor is a mutual capacitance system, as illustrated in FIG. 7, a pair of comb-shaped electrodes are formed with the conductive fine lines 8a, such that the comb shapes are combined in the operation areas (sensor areas) 1d. The point different from the self-capacitance system is the shape of the electrodes, and the line width, the pitch, the opening ratio, the material, and the like of the conductive fine lines 8a may be configured in a similar manner.

The light diffusion layer 9 is provided on the underside of the base sheet 7. The light diffusion layer 9 is also provided in the sensor panel at positions that correspond to the display portions 1c. By providing the light diffusion layer 9, a uniform illumination is achieved and, as described later, the conductive fine lines 8a can be made difficult to see. Furthermore, in the present embodiment, while the external shape of the light diffusion layer 9 is exemplified as having a shape that covers the sensor electrodes 8, the external shape of the light diffusion layer 9 may be of any size that covers the display portions 1c.

Figure 4:
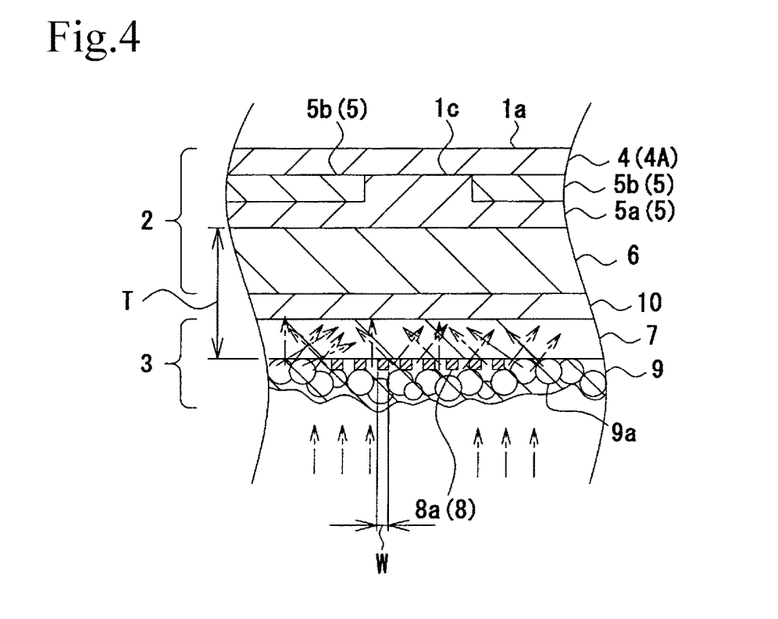
FIG. 4 is an enlarged view of a portion IV in FIG. 3.

By being provided with a high transmittance and an unevenness in the surface, the light diffusion layer 9 has, as illustrated in FIG. 4, light refracting and reflecting properties. The transmittance of the light diffusion layer 9 is preferably 0.5% or higher. In a case in which the transmittance is under 0.5%, the illumination luminance may disadvantageously become too low. The transmittance is, more preferably, 2% or higher, and in such a case, sufficiently bright illumination can be performed. While there is no upper limit in transmittance, when the transmittance exceeds 10%, the optical diffusion characteristics becomes insufficient and, disadvantageously, a uniform illumination may not be performed. Furthermore, it is particularly desirable that the light diffusion layer 9 is colorless; however, the light diffusion layer 9 may not be colorless. Note that the transmittance according to the present invention is a parallel light transmittance of a light having a wavelength of 550 nm when measured with a spectrophotometer. The total light transmittance is preferably 50% or higher.

The unevenness of the surface of the light diffusion layer 9 is preferably 0.3 μm or larger in arithmetic average surface roughness Ra specified in JIS B0601. It is because when Ra is smaller than 0.3 μm, the optical diffusion characteristics is poor and, disadvantageously, a uniform illumination may not be performed. While the upper limit of the Ra value is not limited to any particular value, it is desirable that each uneven reflecting surface is minute enough so as not to be visually recognized; accordingly, the Ra value is preferably 50 μm or smaller.

While the material of the light diffusion layer 9 is not limited to any particular material, it is desirable that, when formed by coating or printing, ink including a transparent filling material 9a that has a grain diameter of about 1 to 100 μm and that has an optical diffusion characteristics is used (see FIG. 4). It is because by printing, a light diffusion layer 9 that includes a predetermined unevenness can be formed with the filling material 9a.

Other than a method of forming the light diffusion layer 9 by coating or printing, the light diffusion layer 9 can be formed by a method performing embossing; however, the method is not particularly limited to the above method. The light diffusing layer 9 is desirably formed by screen printing due to its productivity and the easiness in material adjustment.

In the sensor panel 1 that includes the panel unit 2 and the sensor sheet 3 described above, the following improvements can be made to improve the light diffusing effect of the sensor sheet 3, and to prevent, in a further reliable manner, the conductive fine lines 8a and silhouettes of the conductive fine lines 8a from being seen through the light transmitting layer 5a of the decorative layer 5.

In other words, the relationship between the interlayer distance T between the light transmitting layer 5a (the decorative layer 5) and the sensor electrodes 8, and the line width W of the conductive fine lines 8a satisfies "T≥20W". For example, in a case in which the line width of the conductive fine lines 8a is 100 μm, the interlayer distance T needs to be 2000 μm or more. More specifically, in the present embodiment, the total thickness of the substrate 6, the adhesive layer 10, and the base sheet 7 is equivalent to the interlayer distance T. Although the members that constitute the interlayer are different in FIG. 9 and FIG. 10 described later, configuration is made so that the interlayer distance T is satisfied. In the present embodiment, regarding the members that constitute the interlayer, the thickness of each member is not limited to any thickness; however, since it is normally desirable that the base sheet 7 having a thickness of 10 to 200 μm, and the adhesive layer 10 having a thickness of 10 to 100 μm are used, the thickness of the substrate 6 is adjusted so that the total thickness is the interlayer distance T. Furthermore, since the thickness of the base sheet 7 and the thickness of the adhesive layer 10 are thin with respect to the interlayer distance, even when the thickness of the substrate 6 is set to T or more, there is almost no substantial impact. With the above interlayer distance T, the light diffusing effect can be improved and the conductive fine lines 8a or the silhouettes of the conductive fine lines 8a can be made difficult to be seen through the display portions 1c.

The principle making the conductive fine lines 8a difficult to see is considered to be as follows. Using a translucent white layer, a matt layer with a thick haze, an uneven layer with increased diffusion, a colored light transmitting layer colored into various colors, or the like for the light transmitting layer 5a will enable the conductive fine lines 8a to be hidden and make direct visual perception thereof difficult. However, there is a problem in that in a case in which only such a decorative layer is provided, when illumination is performed with a backlight of the internal light source L, the silhouettes of the conductive fine lines 8a become clearly visible in the display portions 1c. Perusing of the cause of the above lead that the cause was the beam being transmitted in a straight line from the internal light source L to the light transmitting layer 4a; accordingly, the light diffusion layer 9 that diffuses the light guide route of the beam in a random manner has been disposed. As a result of various examinations, it has been found that the ease of such silhouettes being seen relates to the distance T between the line width W of the conductive fine lines 8a and the distance T between the light transmitting layer 4a and the conductive fine lines 8a. Furthermore, it has been found that when the above-described T is a predetermined distance, the silhouettes of the conductive fine lines 8a can be made difficult to be seen, and when a distance that is 20 times of the line width is provided, the silhouettes of the conductive fine lines 8a are almost not created in the decorative layer 5 and a uniform illumination can be performed.

Functions and Effect of Sensor Panel 1:

When the appearance of the sensor panel 1 is viewed during non-illumination, that is, when the internal light source L is not illuminated, the light transmitting layer 5a that forms the display portions 1c do not have a transparency that enables the substrate to be clearly seen. Accordingly, the wiring pattern of the conductive fine lines 8a that is positioned beyond the light transmitting layer 5a and that forms the sensor electrode 8 cannot be visually recognized. Furthermore, during illumination, although the light transmitting layer 5a is illuminated in a bright manner, being hidden, the wiring patterns of the sensor electrodes 8 seen though the light transmitting layer 5a and the light shielding layer 5b was almost not, through the appearance, visually recognized.

In other words, the light proceeding in a straight line from the internal light source L first reaches and enters the light diffusion layer 9 and, as described above, the proceeding direction of the light is diffused in a random manner with the filling material with an optical diffusion characteristics and the light diffusion layer 9 having an uneven surface due to the filling material. Although a portion of the light is shielded by the conductive fine lines 8a and creates the silhouettes, since the proceeding direction of the light is randomly diffused by the light diffusion layer 9, clear silhouettes are not easily formed.

The light that has passed through the conductive fine lines 8a of sensor electrodes 8 and in which the proceeding direction thereof has been randomly diffused reaches the decorative layer 5 after transmitting through the translucent base sheet 7, adhesive layer 10, and substrate 6. In so doing, in the present embodiment, in the relationship with the line width W of the conductive fine lines 8a, since the interlayer distance T described above satisfies "T≥20W", the conductive fine lines 8a and the silhouettes thereof are even more difficult to see in the display portions 1c. Furthermore, the light passes the resin film 4A through the light transmitting layer 5a of the decorative layer 5 and is emitted to the outside. With the above, the display portions 1c are illuminated and displayed in a bright manner. Furthermore, since the silhouettes of the wiring pattern is not seen through in the decorative layer 5, the decorative layer 5 does not have to be thickly coated to hide the silhouettes; accordingly, illumination luminance of the display portions 1c can be increased and visibility can be improved with a thin decorative layer 5.

Accordingly, an illuminated display that achieves both and all of the excellent visibility and brightness and a beautiful appearance serving as a sensor panel 1 that is suitable for, particularly, an on-vehicle electrical component or a home appliance can be devised.

Figure 8:
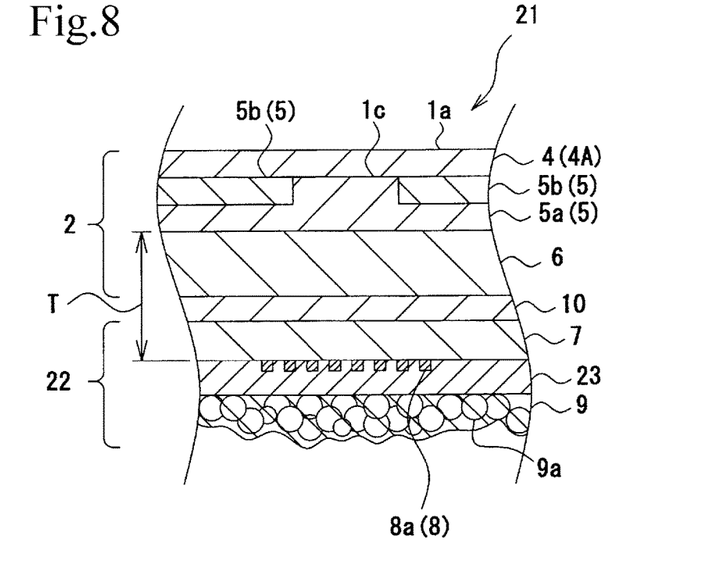
FIG. 8 is an enlarged view of a portion of a sensor panel according to a second embodiment corresponding to FIG. 4.

Second Embodiment [FIG. 8]

A sensor panel 21 of the present exemplary embodiment is a sensor panel in which the sensor sheet 3 of the sensor panel 1 of the first embodiment has been partially modified. While in the first embodiment, the light diffusion layer 9 is directly layered on the sensor electrodes 8, in a sensor sheet 22, a protective layer 23 formed of a resist layer is formed on the sensor electrodes 8, and the light diffusion layer 9 is formed thereon. A hard resin is selected as the resin formed as the protective layer 23 and, for example, acrylic, urethane, epoxy, or polyolefin resin or another resin may be used.

In the sensor panel 21 and the sensor sheet 22, since the conductive fine lines 8a of sensor electrodes 8 can be protected by the protective layer 23, the operational reliability of the sensor panel 21 and that of the sensor sheet 22 can be increased further.

Figure 9:
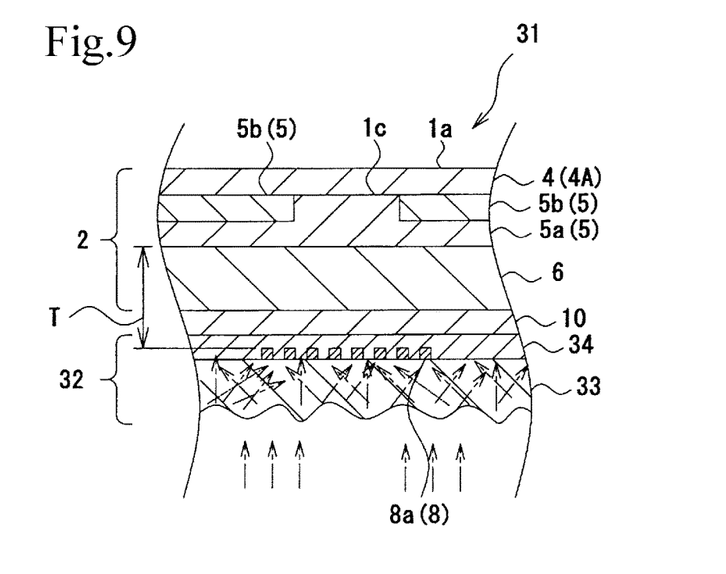
FIG. 9 is an enlarged view of a portion of a sensor panel according to a third embodiment corresponding to FIG. 4.

Third Embodiment [FIG. 9]

A point in which a sensor panel 31 of the present embodiment is different from the sensor panel 1 of the first embodiment is the configuration of a sensor sheet 32. In the sensor sheet 3 of the first embodiment, the sensor electrodes 8 and the light diffusion layer 9 are layered on one surface of the base sheet 7, and the other surface of the base sheet 7 is fixed to the panel unit 2. On the other hand, in the sensor sheet 32, a crimped film processed with an uneven surface on one side is used as a base sheet 33, and the sensor electrodes 8 and a protective layer 34 that is a resist layer that protects the sensor electrodes 8 are layered on the other surface. The protective layer 34 is fixed to the panel unit 2 with the adhesive layer 10. In other words, the base sheet 33 is a base sheet for the sensor sheet 32 and, furthermore, is a light diffusion layer as well; the base sheet 33 has both of the functions.

In the sensor panel 31, since the base sheet 33 also functions as a light diffusion layer, there is no need to separately form a light diffusion layer. Accordingly, by reducing the manufacturing process, the cost can be reduced.

Fourth Embodiment

While in the first embodiment, the light diffusion layer 9 is formed by coating or printing an uneven layer with a filling material with high transparency and optical diffusing characteristics, the light diffusion layer 9 may be a white layer including a light diffusing agent such as titanium oxide. In a case in which the light diffusion layer 9 is a white layer, since the transmittance is under 0.5%, the brightness decreases, however, on the other hand, the optical diffusion characteristics can be increased. In such a case, the relationship "T≥20W" between the interlayer distance T between the light transmitting layer 5b (the decorative layer [[ ]]5) and the sensor electrodes 8, and the line width W of the conductive fine lines 8*a* defined in the first embodiment can be a shorter interval. More specifically, "T≧10W" is satisfied.

Accordingly, in the sensor panel 1 and the sensor sheet 3 of the present embodiment, since the interlayer distance T can be shortened, a thinner sensor panel 1 and sensor sheet 3 can be devised.

Figure 10:
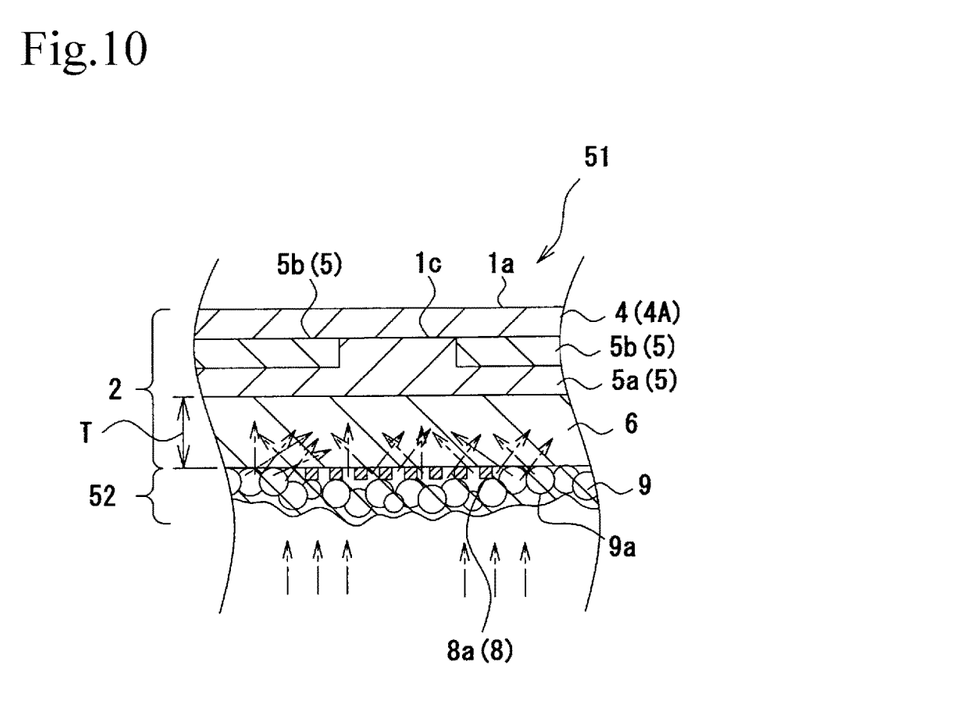
FIG. 10 is an enlarged view of a portion of a sensor panel according to a fourth embodiment corresponding to FIG. 4.

Fifth Embodiment [FIG. 10]

A sensor panel 51 of the present embodiment is different from the sensor panel 1 of the first embodiment in the below point. That is, as for the member constituting the sensor panel 51, in the sensor panel 1 of the first embodiment, the sensor sheet 3 is fixed to the panel unit 2; however, in the sensor panel 51, the panel unit and the sensor panel are not separate components and the sensor electrodes 8 and the like are provided on the sensor panel 51. In other words, the decorative layer 5 formed by the light transmitting layer 5*a* and the light shielding layer 5*b*, and the resin film 4A are layered on the front surface of the substrate 6, and the sensor electrodes 8 and the light diffusion layer 9 are layered on the back surface of the substrate 6. In the present embodiment, the sensor electrodes 8 and the light diffusion layer 9 constitute a sensor sheet 52. Accordingly, the base sheet 7 and the adhesive layer 10 of the first embodiment do not exist in the sensor panel 51. Furthermore, in the sensor panel 51, the thickness of the substrate 6 is the interlayer distance T of the first embodiment, and the relationship with the line width W of the conductive fine lines 8*a* satisfies "T≧20W".

Accordingly, in the sensor panel 51 of the present embodiment, since the base sheet 7 and the adhesive layer 10 are not needed, the number of members that transmit light during illumination can be reduced and the display portions 1*c* can be illuminated in a brighter manner. Furthermore, with the decrease in the number of members, the manufacturing cost can be reduced further.

The feature configurations described in the various embodiments and modifications of the present invention can be combined to the extent that there will be no shortcomings. Furthermore, the embodiments described above are examples and the present invention is not limited to the embodiments and includes any modifications of the shapes, materials, the manufacturing method, and the like of each member that are within the scope of the present invention. For example, in the embodiments described above, examples in which the decorative layer 5 is provided on the front surface side of the substrate 6 has been illustrated; however, the decorative layer 5 may be provided on the back surface of the substrate 6. The interlayer distance T in such a case is the distance between the decorative layer 5 on the back surface side of the substrate 6 and the sensor electrodes 8 that is directly or indirectly layer therebelow.

EXAMPLES

Experimental Example 1

In the present experimental example, in the configuration of the sensor panel 1 illustrated in the first embodiment, samples in which the values of the line width W of the conductive fine lines 8*a*, and the interlayer distance T between the decorative layer 5 and the sensor electrodes 8 were varied were fabricated and the difficulty in seeing the conductive fine lines 8*a* and the silhouettes of the conductive fine lines 8*a* were evaluated.

Sample 1:

A decorative sheet equivalent to the panel unit (2) was fabricated by forming a decorative layer (5) (a light transmitting layer (5*a*)) using a white polyester ink on one surface of the substrate (6) formed of a 350 μm polycarbonate resin plate. Subsequently, a mesh-shaped sensor electrode layer (8) was formed using a silver ink on one surface of a polyethylene terephthalate film, which is different from the substrate (6), having a thickness of 100 μm serving as a base sheet (7). A line width of conductive fine lines (8*a*) constituting the mesh was 80 μm. Furthermore, a sensor sheet (3) was fabricated by printing a light diffusion layer (9) with polyester ink containing transparent silica having a grain diameter of 2 μm, the polyester ink covering the conductive fine lines (8*a*) and serving as a filling material (9*a*) for forming unevenness. Last of all, sample 1 was fabricated by fixing the other surface of the decorative sheet (2) and the other surface of the sensor sheet (3) to each other with a double-sided adhesive tape (10) having a thickness of 50 μm. In sample 1, the interlayer distance T between the decorative layer (5) and the sensor electrode layer (8) was 500 μm.

Regarding the light diffusion layer (9) described above, the measured transmittance when only the light diffusion layer (9) was printed on a non-colored transparent film was 3.4%. Furthermore, an arithmetic average surface roughness Ra of an unevenness of the front surface of the light diffusing layer (9) was 0.63 μm. Note that the transmittance was measured using an ultraviolet and visible spectrophotometer (manufactured by Shimadzu Corporation, "UV-1600"). Furthermore, the arithmetic average surface roughness Ra was measured using a laser microprobe (manufactured by Keyence Corporation, "UK-8510").

Samples 2 to 16:

Samples were fabricated with a similar method as sample 1 while the thickness of the substrate (6) was changed and while, as illustrated in Table 1, various conditions, such as the interlayer distance T between the decorative layer (5) and the sensor electrode layer (8) set to 0.5 mm, 1 mm, 2 mm, or 3 mm, and the line width W of the conductive fine lines (8*a*) changed to 80 μm, 50 μm, 25 μm, or 10 μm were combined.

Evaluation of Diffusibility:

Samples 1 to 16 were disposed above a top-view type, white LED serving as a light source, and the difficultness in seeing the conductive fine lines 8*a* and the silhouettes of the conductive fine lines 8*a* were visually inspected and evaluated. As for the results of the present experiment, the conductive fine lines 8*a* were not visually recognized in all of the samples. On the other hand, there were differences in the appearances of the silhouettes, and a three-grade evaluation was conducted in which (1) "x" represents a sample in which the silhouettes were seen, (2) "Δ" represents a sample in which the silhouettes were in a blurry state and were difficult to see, and (3) "○" represents a sample in which the silhouettes were almost not seen.

TABLE 1

| SAMPLE | LINE WIDTH W μm | INTERLAYER DISTANCE T mm | EVALUATION OF LIGHT DIFFUSIBILITY | T/W VALUE mm |
|---|---|---|---|---|
| 1 | 80 | 0.5 | x | 6.25 |
| 2 | 80 | 1.0 | x | 12.5 |
| 3 | 80 | 2.0 | Δ | 25 |
| 4 | 80 | 3.0 | ○ | 37.5 |
| 5 | 50 | 0.5 | x | 10 |

TABLE 1-continued

| SAMPLE | LINE WIDTH W μm | INTERLAYER DISTANCE T mm | EVALUATION OF LIGHT DIFFUSIBILITY | T/W VALUE mm |
|---|---|---|---|---|
| 6 | 50 | 1.0 | Δ | 20 |
| 7 | 50 | 2.0 | ○ | 40 |
| 8 | 50 | 3.0 | ○ | 60 |
| 9 | 20 | 0.5 | Δ | 25 |
| 10 | 20 | 1.0 | ○ | 50 |
| 11 | 20 | 2.0 | ○ | 100 |
| 12 | 20 | 3.0 | ○ | 150 |
| 13 | 10 | 0.5 | ○ | 50 |
| 14 | 10 | 1.0 | ○ | 100 |
| 15 | 10 | 2.0 | ○ | 200 |
| 16 | 10 | 3.0 | ○ | 300 |

From the evaluation result of the optical diffusion characteristics, a relationship between the interlayer distance T and the line width W was suggested. In other words, it was found that in a sample with a certain line width, when the interlayer distance T was equivalent to or larger than a certain distance, it was difficult to visually recognize the silhouettes of the conductive fine lines (8a). In table 1, when a "T/W value" of each sample in which the evaluation result was "Δ" was calculated, sample 3 was 25, sample 6 was 20, and sample 9 was 25. On the other hand, in each sample in which the evaluation was "x", sample 1 was 6.25, sample 2 was 12.5, and sample 5 was 10. From the above, it has been found that when 12.5 or under, the silhouettes of the conductive fine lines (8a) can be made to be easily seen, and when 20 or more, the silhouettes of the conductive fine lines (8a) can be made to be difficult to see. Furthermore, when 37.5 or more, the silhouettes of the conductive fine lines (8a) were not seen and a particularly uniform illumination was obtained.

Experimental Example 2

The same evaluation as exemplary example 1 was conducted while changing the light diffusion layer (9) of the exemplary example 1 to a while polyester ink containing titanium oxide serving as a light diffusing agent. Regarding the light diffusion layer (hereinafter, also referred to as a white layer), the measured transmittance when only the while polyester ink was printed on a non-colored transparent film was 0.23%, and was lower than the transmittance 3.4% or the light diffusion layer (9) of the exemplary example 1. Furthermore, while the front surface of the light diffusion layer (9) was flat and glossy, the arithmetic average surface roughness Ra was 0.21 μm.

TABLE 2

| SAMPLE | LINE WIDTH W μm | INTERLAYER DISTANCE T mm | EVALUATION OF LIGHT DIFFUSIBILITY | T/W VALUE mm |
|---|---|---|---|---|
| 17 | 80 | 0.5 | x | 6.25 |
| 18 | 80 | 1.0 | ○ | 12.5 |
| 19 | 80 | 2.0 | ○ | 25 |
| 20 | 80 | 3.0 | ○ | 37.5 |
| 21 | 50 | 0.5 | Δ | 10 |
| 22 | 50 | 1.0 | ○ | 20 |
| 23 | 50 | 2.0 | ○ | 40 |
| 24 | 50 | 3.0 | ○ | 60 |
| 25 | 20 | 0.5 | ○ | 25 |
| 26 | 20 | 1.0 | ○ | 50 |
| 27 | 20 | 2.0 | ○ | 100 |
| 28 | 20 | 3.0 | ○ | 150 |
| 29 | 10 | 0.5 | ○ | 50 |
| 30 | 10 | 1.0 | ○ | 100 |
| 31 | 10 | 2.0 | ○ | 200 |
| 32 | 10 | 3.0 | ○ | 300 |

From the evaluation result of the optical diffusion characteristics of the experimental example 2, a relationship between the interlayer distance T and the line width W, when the light diffusion layer (9) was changed to the white layer, was suggested. In table 2, when the "T/W value" of the sample in which the evaluation result was "Δ" was calculated, sample 21 was 10. On the other hand, in the sample in which the evaluation was "x", sample 1 was 6.25. From the above, it has been found that when 6.25 or under, the silhouettes of the conductive fine lines (8a) can be made to be easily seen, and when 10 or more, the silhouettes of the conductive fine lines (8a) can be made to be difficult to see. Furthermore, when 12.5 or more, the silhouettes of the conductive fine lines (8a) were not seen and the illumination was particularly uniform.

Furthermore, in the light diffusion layer (9) of experimental example 2, the transmittance and the illumination luminance are lower than those of exemplary example 1. However, sample 2 in which the evaluation was "x" in exemplary example 1 became "○" in the sample 18 of exemplary example 2, in the same manner, sample 5 that was "x" in exemplary example 1 became "Δ" in sample 21 of exemplary example 2, and samples 3, 6, and 9 that were "Δ" in exemplary example 1 improved to "○" in samples 19, 22, and 25 in experimental example 2. In other words, in experimental example 2 in which the transmittance was low, even when the interlayer distance T is small, as a result, the silhouettes were difficult to see, and it can be understood that a sensor panel (1) with a short interlayer distance T can be devised.

Experimental Example 3

The illumination luminance of the single layer of the light diffusion layer (9) and that of sample 8 of exemplary example 1, and that of the single layer of the light diffusion layer (9) and that of sample 24 of exemplary example 2 were measured. As the measurement method, each sample was disposed on a light table of 1236 cd/m², and the illumination luminance was measured using a luminance meter (LS-100 manufactured by Konica Minolta, Inc.).

TABLE 3

| SAMPLE | LUMINANCE (cd/m²) |
|---|---|
| SINGLE LAYER OF LIGHT DIFFUSION LAYER OF EXPERIMENTAL EXAMPLE 1 | 1300 |
| SAMPLE 8 | 502 |
| SINGLE LAYER OF LIGHT DIFFUSION LAYER OF EXPERIMENTAL EXAMPLE 2 | 540 |
| SAMPLE 24 | 377 |

In table 3, the result show that the light diffusion layer (9) of exemplary example 1 has high transmittance and, as a single layer, is brighter than the brightness of the light table. The above is assumingly because the apparent luminance increased as a result of, together with the diffusion plate of the light table, a further increase in the diffusion effect occurred (the light table is also constituted by a fluorescent light and a diffusion plate). Conversely, in the white layer that is the light diffusion layer (9) of experimental example 2, the luminance was halved to 540 cd/m². Even when compared with samples 8 and 24, it has been shown that using the light diffusion layer (9) of exemplary example 1 enables an illumination with a higher luminance.

The invention claimed is:

1. A sensor panel, comprising:
   a panel substrate;
   a decorative layer provided on a first surface side of the panel substrate; and
   a sensor sheet provided on a second surface side of the panel substrate opposite from the first surface side;
   a display portion that is illuminated by an internal light source; and
   an input operation performed from a front surface side of the panel substrate,
   wherein the sensor sheet has
      a sensor electrode layer including a conductive fine line provided on the back surface side of the panel substrate,
      a diffusion layer provided between the sensor electrode layer and the internal light source, the diffusion layer diffusing a light of the internal light source and transmitting the light to the sensor electrode layer, and
      an interlayer distance T that is a distance in which the decorative layer and the sensor electrode layer of the sensor sheet are set apart, and a line width W of a conductive fine line satisfies $T \geq 20W.$ 2. The sensor panel according to claim 1, wherein the conductive fine line is a conductive coating film having a line width of 5 μm to 300 μm.

3. The sensor panel according to claim 1, wherein the light diffusion layer is an uneven layer including an uneven surface on an internal light source side.

4. The sensor panel according to claim 3, wherein the light diffusion layer is a print layer including an uneven surface on the internal light source side formed by a filling material and a coating film.

5. The sensor panel according to claim 3, wherein the light diffusion layer is a crimped film including an uneven surface formed by a crimped surface on the internal light source side.

6. The sensor panel according to claim 1, the conductive fine line located in the diffusion layer.

7. A sensor panel, comprising:
   a panel substrate;
   a decorative layer provided on a first surface side of the panel substrate; and
   a sensor sheet provided on a second surface side of the panel substrate opposite from the first surface side;
   a display portion that is illuminated by an internal light source; and
   an input operation performed from a front surface side of the panel substrate,
   wherein the sensor sheet has
      a sensor electrode layer including a conductive fine line provided on the back surface side of the panel substrate,
      a diffusion layer provided between the sensor electrode layer and the internal light source, the diffusion layer diffusing a light of the internal light source and transmitting the light to the sensor electrode layer, and
      an interlayer distance T that is a distance in which the decorative layer and the sensor electrode layer of the sensor sheet are set apart, and a line width W of a conductive fine line satisfies $T \geq 10W.$

* * * * *

UNITED STATES PATENT AND TRADEMARK OFFICE
CERTIFICATE OF CORRECTION

PATENT NO. : 10,310,689 B2
APPLICATION NO. : 15/508539
DATED : June 4, 2019
INVENTOR(S) : Yuta Ohsawa

Page 1 of 1

It is certified that error appears in the above-identified patent and that said Letters Patent is hereby corrected as shown below:

On the Title Page

Please amend Item (73) as follows:
Assignee: Sekisui Polymatech Co., Ltd., Saitama (JP)

Signed and Sealed this
Sixteenth Day of July, 2019

Andrei Iancu
*Director of the United States Patent and Trademark Office*